United States Patent [19]

Shibata

[11] 4,309,224
[45] Jan. 5, 1982

[54] METHOD FOR MANUFACTURING A SEMICONDUCTOR DEVICE

[75] Inventor: Tadashi Shibata, Menlo Park, Calif.

[73] Assignee: Tokyo Shibaura Denki Kabushiki Kaisha, Kawasaki, Japan

[21] Appl. No.: 78,783

[22] Filed: Sep. 25, 1979

[30] Foreign Application Priority Data

Oct. 6, 1978 [JP] Japan .................................. 53-122626
Oct. 6, 1978 [JP] Japan .................................. 53-122627

[51] Int. Cl.³ .......................................... H01L 21/268
[52] U.S. Cl. ........................................ 148/1.5; 29/571; 29/576 B; 29/584; 427/53.1; 219/121 LM; 357/23; 357/59; 357/91
[58] Field of Search .................. 29/571, 576 R, 576 B, 29/584, 586; 357/59, 91, 23; 427/53.1; 148/1.5; 219/121 LM

[56] References Cited

U.S. PATENT DOCUMENTS 3,950,187  4/1976  Kirkpatrick ........................ 148/1.5
4,204,894  5/1980  Komeda et al. ..................... 148/188
4,214,918  7/1980  Gat et al. ............................. 148/1.5

OTHER PUBLICATIONS

A. L. Robinson, "Laser Annealing Processing Semiconductors Without a Furnace", Science, vol. 201, pp. 333–335 (1978).

*Primary Examiner*—Aaron Weisstuch
*Attorney, Agent, or Firm*—Oblon, Fisher, Spivak, McClelland & Maier

[57] ABSTRACT

A method for manufacturing a semiconductor device using a polycrystalline silicon layer as an electric conductive portion such as an electrode and/or conductor, which includes steps for doping the polycrystalline silicon layer with an impurity, and applying a radiation beam at least to part of the polycrystalline silicon layer after a heating step, thereby reducing the resistance of the polycrystalline silicon layer thereby to improve the operating speed of the device.

6 Claims, 17 Drawing Figures

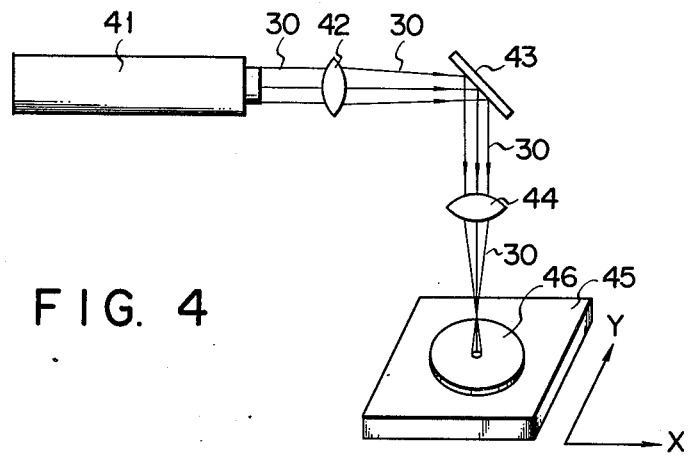
FIG. 4
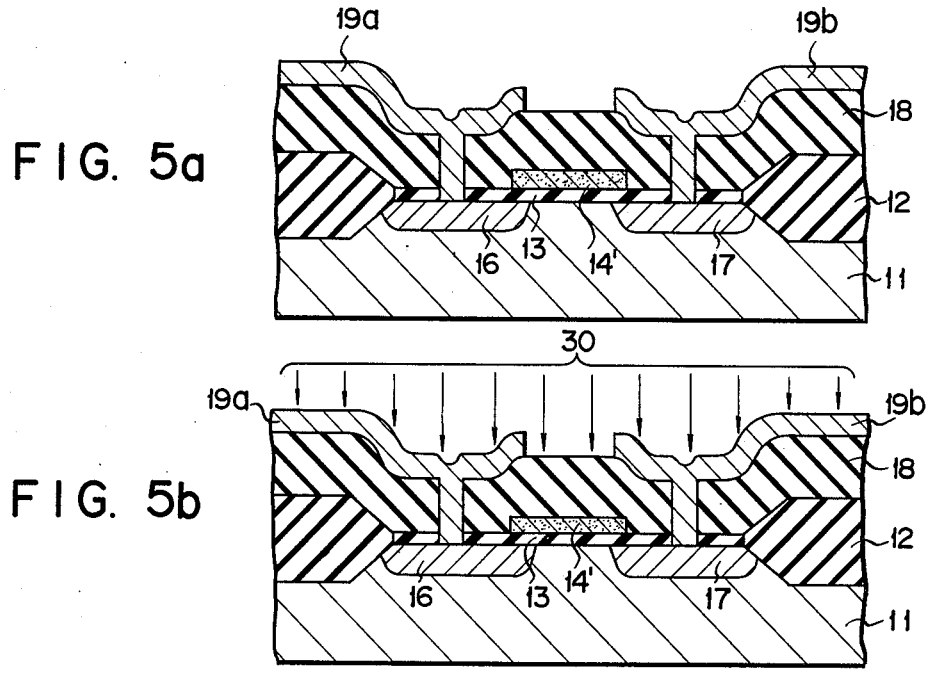
FIG. 5a
FIG. 5b

METHOD FOR MANUFACTURING A SEMICONDUCTOR DEVICE

BACKGROUND OF THE INVENTION

This invention relates to a method for manufacturing an LSI (large scale integration) semiconductor device, and more specifically to a method for manufacturing a semiconductor device using a polycrystalline silicon layer doped with an impurity as an electric conductive portion such as an electrode and/or conductor.

Especially for large scale integration of an MOS (metal oxide semiconductor) type field-effect transistor (FET), an advanced technique is known where the silicon gate technology employs a polycrystalline silicon layer as a gate electrode and forms source and drain regions in the self-alignment system.

The aforesaid silicon gate technology, however, still involves too many problems to achieve further improved LSI.

Referring now to the drawings of FIG. 1, there will be described the above-mentioned problems in connection with a method for manufacturing an LSI n-channel MOS FET, by way of example. As shown in FIG. 1a, a first insulating film such as a silicon oxide ($SiO_2$) film 2 with a thickness of approximately 1 μm is formed on part of the surface of a p-type silicon substrate 1 by selectively oxidizing the surface of the substrate with the aid of e.g. a silicon nitride film mask, thereby isolating elements from one another. Then, as shown in FIG. 1b, a second insulating film such as an $SiO_2$ film 3 as thin as about 700 Å to serve as a gate oxide film is formed on part of the surface of the substrate 1 which is not covered with the $SiO_2$ film 2 by oxidizing the surface, and a polycrystalline silicon layer 4 with a thickness of about 3,000 Å is formed over the whole surface of the $SiO_2$ film 3 by a chemical vapor deposition method, for example.

As shown in FIG. 1c, phosphorous from e.g. $POCl_3$ as a diffusion source is diffused into the whole surface of the polycrystalline silicon layer 4 at approximately 1,000° C. for about 10 minutes. A polycrystalline silicon layer 4' subjected to such phosphorous diffusion exhibits a resistance of approximately 20Ω/□, as indicated by the full line of FIG. 2.

A photo-resist film 5 is formed selectively on the polycrystalline silicon layer 4' doped with the impurity, as shown in FIG. 1d, and the polycrystalline silicon layer 4' is plasma-etched for patterning by using e.g. freon plasma, and part of the polycrystalline silicon layer 4' is left to form a gate electrode.

Subsequently, as shown in FIG. 1e, n-type source and drain regions 6 and 7 are formed by removing portions of the 700 Å $SiO_2$ film 3 to form the source and drain regions, further removing the photo-resist film 5, implanting e.g. 150 kev As ions at a rate of $1 \times 10^{16}/cm^2$, and annealing the resultant structure in an $N_2$ atmosphere at approximately 1,000° C. for about one hour.

Then, as shown in FIG. 1f, one or more third insulating films such as a relatively thick (about 1 μm) $SiO_2$ film 8 including phosphorus in a concentration of approximately $1 \times 10^{21}$ atoms/$cm^3$ is formed all over the surface by the chemical vapor method, and heated at a temperature of approximately 1,050° C. for 20 minutes to have its surface melt. Thereafter, contact holes for leading out electrodes from the source and drain regions 6 and 7 are made in the $SiO_2$ film 8, and aluminum layers 9a and 9b are deposited and delineated (FIG. 1g).

Then, an oxide film doped with e.g. phosphorus or a PSG film 10 is formed on the Al layers, and finally a bonding-pad opening 10a is made in the PSG film 10.

As stated previously the resistance of the polycrystalline silicon layer 4' which forms the gate electrode, manufactured by the above-mentioned prior art method, is approximately 20Ω/□. This resistance value, which may be decreased as the diffusion time of impurity (phosphorus) increases as indicated by full line in FIG. 2, will never be reduced below approximately 20Ω/□. This may be attributable to the fact that the concentration of phosphorus in the polycrystalline silicon layer never increases above the solid solubility limit. Although the resistance value may substantially be halved by e.g. doubling (to approx. 6,000 A) the thickness of the polycrystalline silicon layer, the increased thickness will make it difficult to achieve accurate and fine patterning. Such a way of reducing the resistance would, therefore, be not appropriate for the formation of fine patterns, especially. When using the polycrystalline silicon layer as a conductor to transmit signals in an LSI, on the other hand, it is necessary that the resistance value of the layer be minimized to increase the operating speed of the device. The above-mentioned prior art method has not been able to fulfill those requirements.

SUMMARY OF THE INVENTION

The object of this invention is to provide a method for manufacturing a semiconductor device characterized by comprising the following steps.

That is, according to this invention, there is provided a method for manufacturing a semiconductor device which comprises a step of forming an insulating film at least on part of the surface of a semiconductor substrate, a step of forming an electric conductive portion such as an electrode and/or a conductor portion made of a polycrystalline silicon layer doped with an impurity, at least on said insulating film, a step of heating in which at least said electric conductive portion made of said polycrystalline silicon layer is heated, and a step of applying a radiation beam to at least said electric conductive portion made of said polycrystalline silicon layer, after said heating process.

Further, according to the invention, there is provided a method for manufacturing a semiconductor device in which at least part of the surface of one or more insulating film or films covering the electric conductive portion is reflowed by high temperature heating, and the laser light or electron beam is applied at least to the electric conductive portion formed of the polycrystalline silicon layer through the reflowed insulating film or films.

Moreover, according to the invention, there is provided a method for manufacturing a semiconductor device in which a metal layer and the polycrystalline silicon layer are used as the electric conductive portion, and the metal layer is formed on the surface of other insulating film or films and is heated before the radiation beam is applied to the polycrystalline silicon electric conductive portion at least through the insulating film or films.

Further, according to the invention, there is provided a method for manufacturing a semiconductor device in which at least one layer of the insulating film or films covering the polycrystalline silicon is composed of a silicon oxide film or a silicon oxide film doped with at least one kind of impurity chosen from the group consisting of phosphorus, arsenic and boron.

Moreover, according to the invention, there is provided a method for manufacturing a semiconductor device in which the impurity with which the polycrystalline silicon layer is doped is arsenic or phosphorus.

Furthermore, according to the invention, there is provided a method for manufacturing a semiconductor device in which the metal layer is an aluminum layer or an aluminum layer containing silicon.

Additionally, according to the invention, there is provided a method for manufacturing a semiconductor device in which the resistance value of the polycrystalline silicon layer is controlled by controlling the output power of the radiation beam in the process for applying the radiation beam.

BRIEF DESCRIPTION OF THE DRAWING

FIG. 4 is a perspective view showing an outline of a laser system for irradiation used in the embodiment of the invention;

FIGS. 5a to 5c are sectional views for illustrating the main steps in a method for manufacturing an n-channel MOS FET according to another embodiment of the invention;

DETAILED DESCRIPTION OF THE PREFERRED EMBODIMENTS

Now there will be described a method for manufacturing an LSI n-channel MOS FET according to an embodiment of this invention with reference to the accompanying drawings.

Figure 1A:
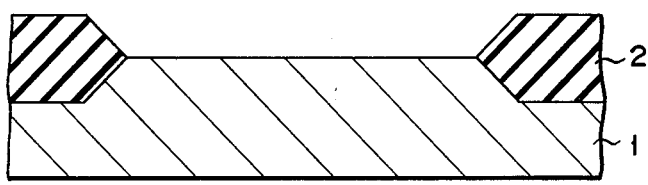
FIGS. 1a to 1h are sectional views for illustrating the steps in a prior art method for manufacturing an n-channel MOS FET.
Figure 1B:
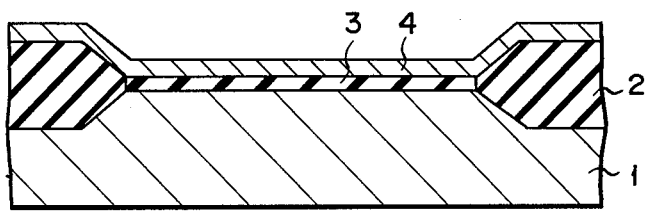
Figure 1C:
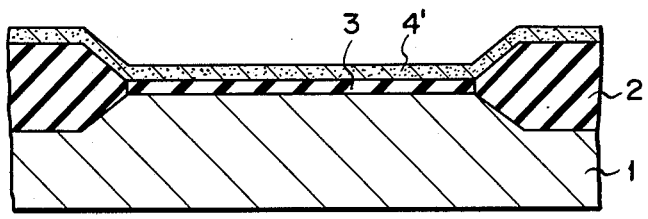
Figure 1D:
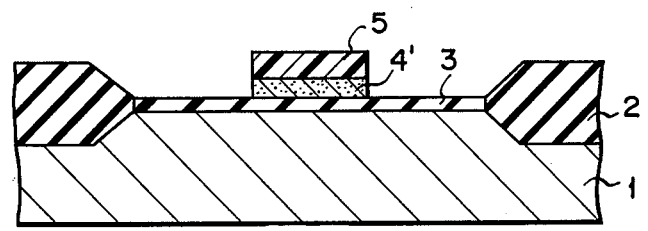
Figure 1E:
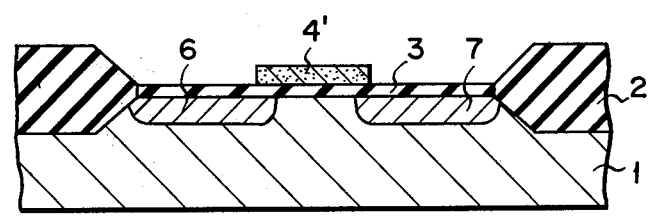
Figure 1F:
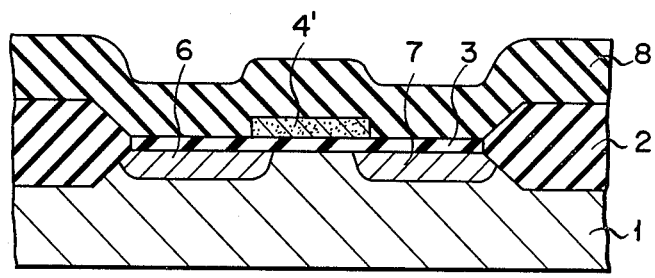
Figure 1G:
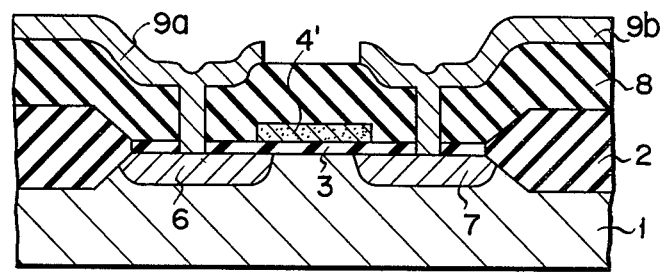
Figure 1H:
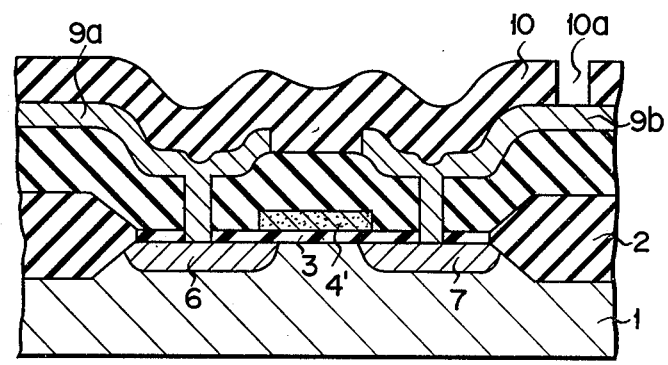
Figure 3A:
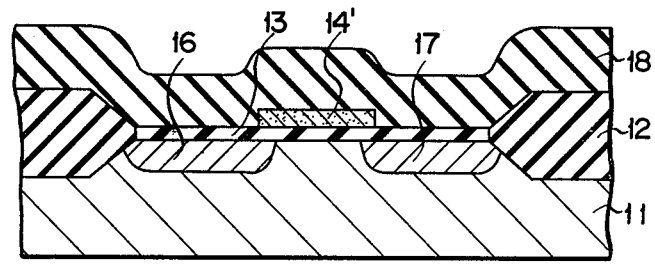
FIGS. 3a to 3c are sectional views for illustrating the main steps in a method for manufacturing an n-channel MOS FET according to an embodiment of this invention.
Figure 3B:
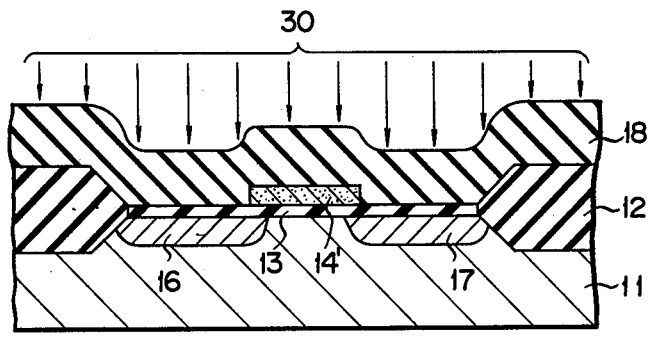
Figure 3C:
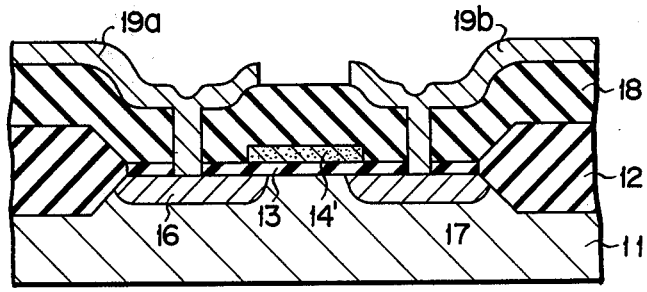

FIGS. 3a to 3c each show part of the main steps of the method of the invention, FIGS. 3a and 3c corresponding to FIGS. 1f and 1g, respectively. Accordingly, the steps preceding the step of FIG. 3a are the same as the steps prior to the step of FIG. 1f, and the steps following the step of FIG. 3c are the same as the steps subsequent to the step of FIG. 1g. Already described in detail, the steps shown in FIG. 1 will not be further described, for simplicity of explanation.

In accordance with the above-mentioned steps of FIG. 1, a first insulating film such as an $SiO_2$ film 12 for isolation of elements, a second insulating film such as an $SiO_2$ film 13 for the gate oxide film, a phosphorus-doped polycrystalline silicon layer 14′, source and drain regions 16 and 17, and one or more third insulating films such as an $SiO_2$ film 18 with a thickness of approximately 1 $\mu$m are formed on or over a p-type silicon substrate 11, as shown in FIG. 1f or FIG. 3a, and the $SiO_2$ film 18 is heated at a temperature of approximately 1,050° C. for about 20 minutes to have its surface melt or reflow.

Then, as shown in FIG. 3b, laser radiation 30 is applied to the polycrystalline silicon layer 14′ through the $SiO_2$ film 18. The laser radiation 30 may, for example, be pulsed laser radiation with a pulse width of 20 to 200 nsec and a frequency of 5 to 30 kHz emitted from an Nd-YAG laser system 41 with a maximum output of 10W, as shown in FIG. 4. The laser radiation 30 passes through a first lens 42 and is reflected at an angle of 90° by a reflector 43, is narrowed down to approximately 40 to 80 $\mu$m in beam diameter by means of a second lens 44, and applied to a wafer 46 placed on a stage 45. The whole surface of the wafer 46 with the polycrystalline silicon layer formed thereon can be irradiated by scanning the stage 45 in both X and Y directions.

Figure 2:
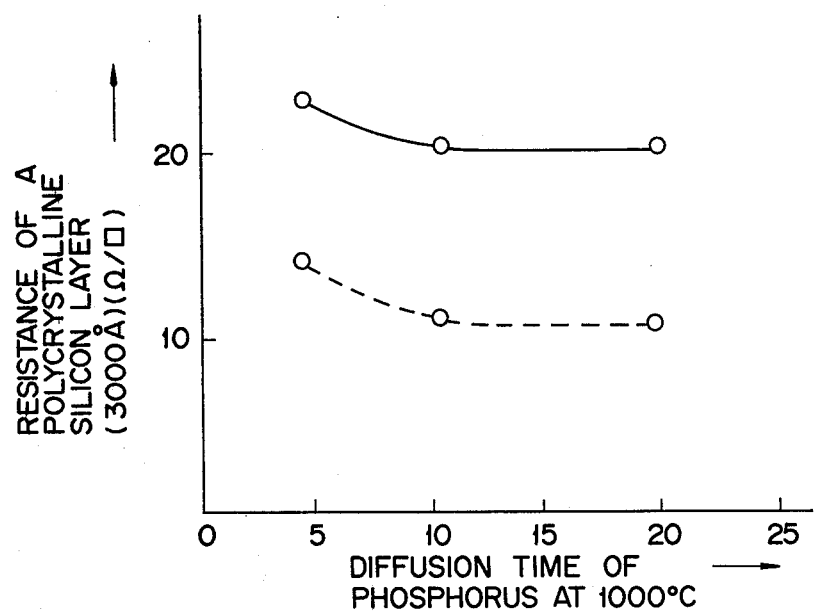
FIG. 2 shows characteristic curves illustrating the relationship between the diffusion time of phosphorus and the resistance of a polycrystalline silicon layer.
Figure 6:
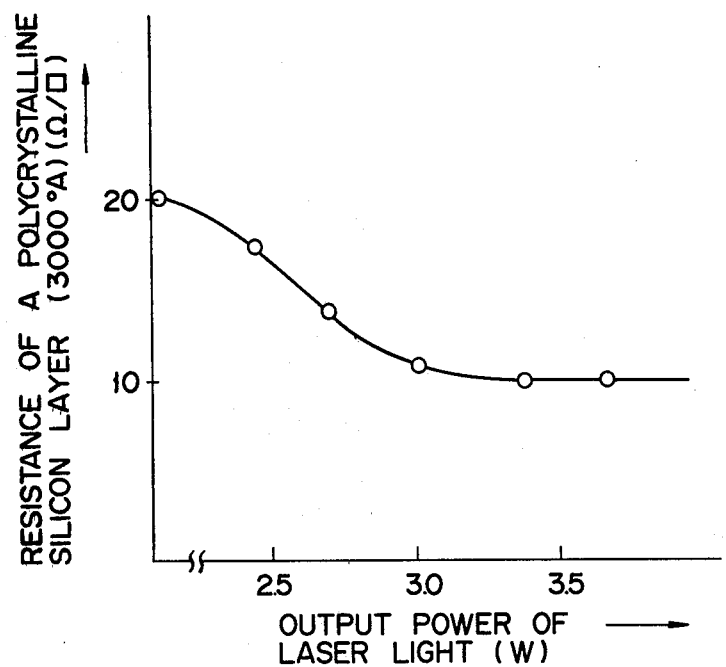
FIG. 6 shows a characteristic curve illustrating the relationship between the output power of laser light and the resistance of a polycrystalline silicon layer according to the invention.

By thus applying the laser radiation 30 to the polycrystalline silicon layer 14′ through the reflowed $SiO_2$ film 18, the resistance of the polycrystalline silicon layer 14′ is approximately halved as compared with the level before the application of the laser radiation 30, that is, reduced to approximately 10$\Omega$/□, as indicated by broken line of FIG. 2 or shown in FIG. 6, thereby enabling the use of the layer 14′ as the gate electrode.

Subsequently, as shown in FIG. 3c, contact holes for the electrode lead out from the source and drain regions 16 and 17 are opened, an aluminum layer is formed over the entire surface by evaporation, and the Al layer is formed into optionally patterned Al layers 19a and 19b. Thereafter, the same steps subsequent to the one shown in FIG. 1g are followed to complete the entire manufacturing process.

As described above, the resistance value of the polycrystalline silicon layer of the MOS FET provided by the above-mentioned method is reduced to half the value obtained before the irradiation. However, nothing has been made clear about the mechanism of such effect, as yet. It may be guessed that, on activation of phosphorus, which has been electrically inactive, by the application of the laser radiation, the structure of the grains of the polycrystalline silicon layer is changed and the carrier mobility is increased. If doped with As, the polycrystalline silicon layer will exhibit a resistance of approximately 30$\Omega$/□ as its lowest value. Such a minimum resistance value may be nearly halved by applying laser light to the layer. Heretofore, if there was included a heat treatment at 600° C. or more after irradiation, e.g. a heating process at 1,000° C. for about one hour in concurrence with the formation of the source and drain regions by ion implantation, and an $SiO_2$ film reflowing process (at 1,050° C. for 20 minutes), the resistance of the polycrystalline silicon layer was restored substantially to its original value. According to the invention as described above, however, the application of the laser radiation is performed after the formation of the source and drain regions 16 and 17 and also after the reflowing of the $SiO_2$ film 18, so that all the heating steps subsequent to this irradiation step are the heating step for the ohmic contact by the Al layers and the chemical vapor deposition step for the PSG film, each of which only requires temperatures lower than 500° C. Thus, according to the invention, the resistance value of the polycrystalline silicon layer will hardly be restored to the original value. In the case when the polycrystalline silicon layer is doped with arsenic, the change of the resistance value after the irradiation step is less than with polycrystalline silicon doped with phosphorus.

As may be evident from the above description, the method of this invention has such advantages that the polycrystalline silicon layer may have its resistance value reduced without increasing its thickness, production of finished elements as well as processing of the polycrystalline silicon layer may be speeded-up.

Figure 5C:
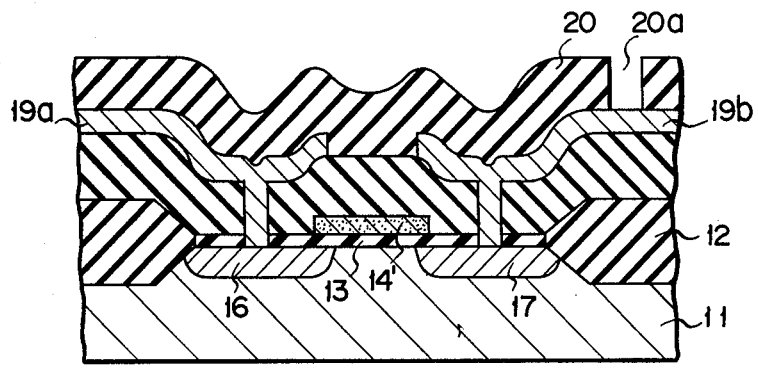

Referring now to FIGS. 5a to 5c, there will be described another embodiment of this invention. Like the drawings of FIG. 3, these drawings show only the main steps; FIGS. 5a and 5c correspond to FIGS. 1g and 1h, respectively. Since the steps of FIG. 5 are substantially the same as the ones shown in FIG. 3, except for the different order of the irradiation step, like reference numerals refer to the same parts throughout the drawings for ease of explanation.

In accordance with the above-mentioned steps of FIG. 1, a first insulating film such as an $SiO_2$ film 12 for isolation of elements, a second insulating film such as an $SiO_2$ film 13 for the gate oxide film, a phosphorus-doped polycrystalline silicon layer 14', source and drain regions 16 and 17, one or more third insulating films such as an $SiO_2$ film 18 with a thickness of approximately 1 $\mu$m, and Al layers 19a and 19b for the electrode connecting to the source and drain regions 16 and 17 are formed on or over a p-type silicon substrate 11, as shown in FIG. 1g or FIG. 5a.

Then, as shown in FIG. 5b, laser radiation 30 is applied to the surfaces of the Al layers 19a and 19b and the $SiO_2$ film 18 by using the same laser system as described in connection with the embodiment of FIG. 3. In this case, the laser radiation 30 is applied to the polycrystalline silicon layer 14' through a portion of the $SiO_2$ film 18 which is not covered with the patterned Al layers 19a and 19b. As in FIG. 3, therefore, the resistance of the polycrystalline silicon layer 14' is approximately halved to enable use of the layer 14' as the electric conductive portion such as an electrode and/or conductor. Moreover, according to this embodiment, the application of the laser radiation 30 is performed after sintering the Al layers 19a and 19b, so that the resistance of the polycrystalline silicon layer will hardly be increased after the irradiation.

Subsequently, as shown in FIG. 5c, a PSG film 20 with a thickness of e.g. 1 $\mu$m is formed all over the surface, and finally an electrode opening 20a is bored in the PSG film 20.

Although in the above embodiments the laser radiation is applied to the polycrystalline silicon layer to reduce its resistance value to approximately $\frac{1}{2}$ its initial value, the desired performance may be obtained by adjusting the output power of the laser radiation in accordance with the characteristic curve of FIG. 6 so as to set the resistance of the polycrystalline silicon layer at a suitable value after evaluating the characteristics of e.g. a finished LSI, since the resistance of the polycrystalline silicon layer can be varied substantially continuously with the output power of the laser radiation. This may be applied to the case where a characteristic is adjusted by applying laser radiation selectively to polycrystalline silicon used as a resistor in, for example, a linear circuit employing a bipolar element, especially.

The reflowed $SiO_2$ film through which the laser radiation is applied in the embodiment of FIG. 3 may be replaced by a CVD $SiO_2$ film or a double layer system combining CVD $SiO_2$ and PSG. Further, the irradiation, which is performed after the sintering at 500° C. of the Al layers according to the embodiment of FIG. 5, may be done after the final step, for example the formation of the PSG film 20. Moreover, the insulating layer formed on the polycrystalline silicon layer may be any of $SiO_2$, PSG, and BPSG (boron and phosphorus doped $SiO_2$) films.

Further, although the polycrystalline silicon layer is doped with phosphorus from $POCl_3$ as a diffusion source according to the above-mentioned embodiments, phosphorus as an impurity may be replaced by at least one of arsenic, boron, aluminum, germanium, tin, antimony, oxygen, nitrogen and hydrogen, and solid-phase diffusion or ion implantation may be employed as an impurity introducing means. The impurity doping of the polycrystalline may be done at the same time as forming the polycrystalline layer, or after patterning of the polycrystalline layer.

Moreover, in the above-mentioned embodiments, the polycrystalline silicon layer is doped with an impurity independently of the formation of the source and drain regions. Such doping may, however, be performed in concurrence with the formation of the source and drain regions.

Further, the p-type Si substrate used for the above-mentioned embodiments may be replaced by an n-type Si substrate. Boron may be used as an impurity for the formation of source and drain regions. And a metal (for example, aluminum) layer containing silicon may be used as the metal layer.

Moreover, although there has been described a method for manufacturing an n-channel MOS FET according to the above embodiments, the method of this invention may be applied also to CMOS's and bipolar transistors.

It is obviously understood that this invention may be also effected in a polycrystalline silicon conductor by itself, or in a polycrystalline silicon gate electrode and its connecting conductors.

Furthermore, although pulse irradiation has been described in connection with the above embodiments, a CW laser light may be applied in concurrence with scanning at a speed of 20 cm/sec, or the substrate may previously be heated to approximately 100° to 500° C. before irradiation. Naturally, according to this invention, the laser radiation may be replaced by any other suitable source of radiation, such as an electron beam, to reduce the resistance of the electric conductive portion made of a polycrystalline silicon layer.

It is to be understood that the method of this invention is not limited to the above-mentioned precise embodiments, and that various changes and modifications may be effected therein by one skilled in the art without departing from the scope or spirit of the invention.

What is claimed is:

1. A method for manufacturing a semiconductor device comprising the steps of:
    forming an insulating film on at least part of the surface of a semiconductor substrate;
    forming an electric conductive portion made of polycrystalline silicon layer doped with at least one impurity, at least on said insulating film;
    heating said semiconductor substrate to permit at least said electric conductive portion made of said polycrystalline silicon layer to be heated; and
    applying a radiation beam at least to said electric conductive portion after said heating step, thereby reducing the resistance value of said electric conductive portion.

2. A method for manufacturing a semiconductor device according to claim 1, wherein at least said electric conductive portion is covered by at least one insulating film, and at least part of the surface of said at least one insulating film is heated to be melted and reflowed during said heating step, and said radiation beam is applied at least to said electric conductive portion formed of said polycrystalline silicon layer at least through said reflowed insulating film.

3. A method for manufacturing a semiconductor device according to claim 1, wherein at least said electric conductive portion is covered by at least one insulating film, and a metal layer is also used as an electric conductive portion and is formed on at least the surface of said at least one insulating film, and heated during said heating step before said radiation beam is applied to said polycrystalline electric conductive portion at least through said at least one insulating film.

4. A method for manufacturing a semiconductor device according to claim 3, wherein said metal layer is an aluminum layer or an aluminum layer containing silicon.

5. A method for manufacturing a semiconductor device according to claim 1, wherein the at least one impurity with which said polycrystalline silicon layer is doped includes at least one of arsenic, phosphorus, boron, aluminum, germanium, tin, antimony, oxygen, nitrogen, and hydrogen.

6. A method for manufacturing a semiconductor device according to claim 1, wherein said resistance value of said electric conductive portion is controlled by controlling the beam power of said radiation beam in said step of applying said radiation beam.

* * * * *